United States Patent [19]
Vice

[11] Patent Number: 6,064,872
[45] Date of Patent: May 16, 2000

[54] TOTEM POLE MIXER HAVING GROUNDED SERIALLY CONNECTED STACKED FET PAIR

[75] Inventor: Michael Wendell Vice, El Granada, Calif.

[73] Assignee: Watkins-Johnson Company, Palo Alto, Calif.

[21] Appl. No.: 08/926,175

[22] Filed: Sep. 9, 1997

Related U.S. Application Data

[60] Continuation-in-part of application No. 08/574,071, Dec. 18, 1995, Pat. No. 5,752,181, which is a division of application No. 08/376,126, Jan. 19, 1995, Pat. No. 5,551,074, which is a continuation of application No. 08/105,292, Aug. 10, 1993, abandoned, which is a division of application No. 08/004,234, Jan. 14, 1993, Pat. No. 5,361,409, which is a continuation of application No. 07/668,248, Mar. 12, 1991, abandoned.

[51] Int. Cl.[7] .................................................. H04B 1/26
[52] U.S. Cl. ........................... 455/326; 455/333; 333/119
[58] Field of Search ..................................... 455/333, 318, 455/319, 323, 332; 327/356; 333/101, 24 R, 245, 246, 25, 26, 117, 119, 177

[56] References Cited

U.S. PATENT DOCUMENTS

| | | | |
|---|---|---|---|
| 3,577,206 | 5/1971 | Ferrell | 307/240 |
| 5,027,163 | 6/1991 | Dobrovolny | 455/326 |
| 5,280,648 | 1/1994 | Dobrovolny | 455/326 |
| 5,361,409 | 11/1994 | Vice | 455/326 |
| 5,396,659 | 3/1995 | Kimura | 455/333 |
| 5,513,390 | 4/1996 | Vice | 455/323 |
| 5,514,992 | 5/1996 | Tanaka et al. | 327/317 |
| 5,551,074 | 8/1996 | Vice | 455/326 |
| 5,602,501 | 2/1997 | Shiga | 327/105 |
| 5,697,092 | 12/1997 | Mourant et al. | 455/323 |

OTHER PUBLICATIONS

LaFerrara, H., et al. "GaAs MMIC Passive Mixers for Wireless Applications", *M/A–COM, IC Business Unit*, Lowell, Massachusetts.

*Primary Examiner*—Edward F. Urban
*Attorney, Agent, or Firm*—Flehr Hohbach Test Albritton & Herbert

[57] ABSTRACT

A high dynamic range mixer apparatus and mixing method where a wide high dynamic range is achieved in part due to the use of a series pair of switching devices that are matched so as to afford complete or substantial cancellation of nonlinearity distortion. The inventive structure and method preserves the compensation and cancellation mechanism of the series pair of back-to-back connected FETs without the need for either of an intermediate frequency (IF) balun or a radio-frequency (RF) balun. Typically, the switching devices are PETs, such as for example MESFETs, connected source-to-source with one drain terminal grounded, and a non-grounded or floating switching signal applied between the common gate and common source terminals.

20 Claims, 9 Drawing Sheets

TOTEM POLE MIXER HAVING GROUNDED SERIALLY CONNECTED STACKED FET PAIR

RELATED PATENT APPLICATIONS

This patent application is a continuation-in-part of U.S. patent application Ser. No. 08/574,071, titled *Method and Apparatus For Reducing Intermodulation Distortion in a Mixer* filed Dec. 18, 1995, now U.S. Pat. No. 5,752,181, which is a Divisional Application of 08/376,126 filed Jan. 19, 1995, now U.S. Pat. No. 5,551,574; which is a Continuation of 08/105,292 filed Aug. 10, 1993; now abandoned, which is a Divisional of 08/004,234 now U.S. Pat. No. 5,361,409 filed Jan. 14, 1993; which is a Continuation of 07/668,248 filed Mar. 12, 1991; now abandoned and each of which patent and patent application is incorporated by reference herein in its entirety.

FIELD OF THE INVENTION

The invention relates generally to radio frequency communication devices and more specifically to a circuit for use in a mixer having a large dynamic range.

BACKGROUND OF THE INVENTION

Conventional FET mixer circuits 20 having a mixing FET 21, and having either of both IF and RF baluns (possibly in the form of a transformer), and exhibiting balanced IF and RF signals are known. The requirement for baluns in these conventional mixer circuits, particularly for the IF balun 22 which operates in a relatively low signal frequency range (typically from about 10 MHz to about 300 Mhz) as a low frequency transformer device, severely limits the ability to fabricate the conventional mixer as a monolithic structure, such as in a monolithic microwave semiconductor integrated circuit (MMIC), given the practical difficulty of providing suitable inductive elements on or within the integrated structure. Even where monolithic fabrication is not a requirement, substantial additional production and material costs are typically incurred when discrete components, especially inductors, are used or added to an otherwise integrated circuit structure.

Mixer-to-mixer operational uniformity may also suffer when discrete components, such as discrete wire-wound inductors, are used in the mixer circuit as a result of the typically higher variability of discrete components relative to the generally lower variability of circuit elements formed as integrated circuit structures. Therefore, additional structures, such as trimming capacitors or the like, may also be required in mixer circuits when discrete components are relied upon.

One type of integrable FET mixer has been marketed by M/A-COM (MD54-001, -003, -004, -005, -006 line of mixers manufactured by M/A-COM, IC Business Unit, 100 Chelmsford St., Lowell, Mass. 01853). This mixer uses a single mixing FET which is not grounded on either end of the channel, and is purported by M/A-COM as having a third order intercept point of about +18 dBm, but this performance has not been verified by the present inventor. The single FET is fed by an Radio-Frequency (RF) balun and the circuit's intrinsically balanced Intermediate-Frequency (IF) output is force coupled, via a diplexer internal to the mixer, to the unbalanced IF port of the mixer. No explicit IF balun is provided, and any distortion reduction that may be provided by the circuit components would necessarily be limited by the single mixing FET implementation of the circuit.

Therefore while there have been attempts to provide a fully integrable mixer having a large dynamic range, excellent linearity, and low distortion, the prior-art mixers by and large fail to satisfy the need for fully integrable mixers that provide the degree of linearity with distortion suppression or complete distortion cancellation desired, and which also eliminate the need for IF and RF baluns. Such high-performance, fully integrated implementations are highly desirable for compact communication products, including cost-efficient wireless communication products for base station of remote communication capability. Such products include cellular and PCS wireless telephones. For these and other reasons there continues to be a need to provide high-performance mixers that eliminate IF and RF baluns and are capable of full integration on a monolithic substrate.

SUMMARY OF INVENTION

The invention provides a high dynamic range mixer apparatus and mixing method where a wide high dynamic range is achieved in part due to the use of a series pair of switching devices that are matched so as to afford complete or substantial cancellation of nonlinearity distortion. The inventive structure and method preserves the compensation and cancellation mechanism of the series pair of back-to-back connected FETs without the need for either of an intermediate frequency (IF) balun or a radio-frequency (RF) balun. Typically the switching devices are FETs, such as for example MESFETs, connected source-to-source with one drain terminal grounded, and a non-grounded or floating switching signal applied between the common gate and common source terminals.

In one aspect, the invention provides a mixer circuit including first and second substantially matched switching devices each having an input terminal and an output terminal. One of these switching devices output terminals is connected to ground and the other of the output terminals is connected to the input terminal of the switching device having a grounded output terminal to form a common circuit node. The inventive mixer circuit also includes an isolation circuit, such as a circuit comprising an isolation transformer, adapted to receive an externally applied local oscillator (LO) signal at an input port and to generate a floating switching signal at an output port where the output port is coupled to the first and second switching devices. The mixer circuit may be used as an up-converter or down-converter.

In another aspect, the mixer circuit, the two switching elements are transistors, such as FETs, and each three-terminal transistor device has gate or control terminal, a source terminal, and a drain terminal. The gate terminals are connected together, and the two source terminals are connected together. The first FET input terminal corresponds to a FET drain, the first FET output terminal corresponds to a FET source, the second FET input terminal corresponds to a FET source, and the second FET output terminal corresponds to the FET drain connected to ground. In this particular implementation, the floating switching signal is coupled across said common gate terminals and said common source terminals.

In yet another aspect, the inventive mixer provides a mixing device for generating a mixer output signal including a first and a second FET, each having a gate and a drain and a source, the first and second FETs having their gates tied to one another and their sources tied to one another such that the first and second FETs are connected source-to-source in series and have substantially equal magnitude gate-to-source voltages at all times and have substantially equal magnitude but opposite sign drain-to-source voltages at all times. In this circuit the second FET drain is connected to ground, and an RF/IF diplexer circuit is connected to the first FET drain and had an RF signal coupling port and an IF signal coupling port for communicating RF and IF signals between the first FET drain and external sources (sinks) and sinks (sources) of RF (IF) and IF (RF) signals. A transformer having a primary and secondary portion is also provided where the primary portion (winding) has a first terminal connected to a LO input port for receiving an external LO input signal and a second terminal connected to ground, the secondary portion (winding) has a third terminal connected to the FET gates and a fourth terminal connected to the FET sources, where the secondary winding and the FET gates and sources are floating and not tied to ground. The transformer receives the local oscillator signal and generates a floating drive signal between the joined or common FET gate terminals and the common or joined FET source terminals in order to switch the conduction state of the serially connected FETs between a conducting state and a non-conducting state. The RF/IF diplexer circuit receives an input signal and couples the input signal to the first FET drain, the input signal passing through the channel combination formed by the first and second FETs during the time the FETs are conducting and mixing the floating local oscillator signal with the input signal to generate the output signal. The diplexer having an output port for extracting the output signal. During operation, the one FET introduces a first component of intermodulation distortion in the output signal related to the change in channel resistance of the first FET during channel conduction, and the second FET introduces a second component of intermodulation distortion in the output signal related to the change in channel resistance of the second FET during channel conduction, the second component being substantially equal in magnitude but opposite in sign to the first component; the back-to-back serial FET connection being operative to sum and cancel the first distortion component with the second distortion component so that the overall intermodulation distortion introduced in the mixer output signal is suppressed.

These and other features and advantages to the invention will be apparent from reference to the detailed description of the invention and appurtenant figures.

DETAILED DESCRIPTION OF THE INVENTION

The invention pertains to wide or high dynamic range mixers, those in particular whose dynamic range is achieved in part due to the use of a back-to-back series pair of switching devices, such as switching field effect transistors (FETs) that are matched so as to afford complete or nearly complete cancellation of nonlinearity distortion including intermodulation distortion, or when closely but not completely matched to provide correspondingly nearly complete or substantial cancellation of nonlinearity distortion.

The use of one configuration of a series connected FETs to reduce intermodulation distortion in a mixer has been described in U.S. patent application 08/574,071, titled *Method and Apparatus For Reducing Intermodulation Distortion in a Mixer;* the use of a transmission line transformer in a mixer has been described in U.S. Pat. No. 5,361,409 titled *FET Mixer Having Transmission Line Transformer;* the use of a balanced reflection transformer in a mixer has been described in U.S. Pat. No. 5,551,074 titled *Balanced Reflection Transformer;* and the use of a dc-biased reflection transformer for a mixer and a dc-biased FET mixer have been described in U.S. Pat. No. 5,513,390 titled Biased FET Mixer. Each of these patents and patent applications are hereby incorporated by reference in their entirety.

The present invention preserves the mechanism of the series pair of PETs without the need for an intermediate frequency (IF) balun, which is conventionally provided, and which due to the operating frequency range is usually physically large. Although the inventive structure and method are not limited to application or operation in any particular frequency range, for example the inventive structure and method may be used in the audio frequency range (e.g. 1KHz) through 10 Gigahertz (Ghz) or more. For the exemplary circuits show and described herein the nominal IF frequency range is from about between about 10 Mhz and 300 Mhz, and a suitable coil and core transformer type IF balun may be on the order of 6 mm×6 mm×6 mm. Alternatively, a fully integrated monolithic IF balun would likely require hundreds of millimeters or more on each side, and would never be seriously considered.

Hence, elimination of the requirement for an IF balun by the invention allows a mixer circuit according to the present invention to be integrated onto a single monolithic semiconductor integrated circuit chip, such as a silicon (Si), gallium arsenide (GaAs), or other material having reduced dimension, fabrication ease, and enhanced operating performance. The manner in which performance is enhanced is described subsequently. The inventive mixer circuit may also be implemented in other than a fully integrated manner, for example by any conventional electronic circuit fabrication method, such as by using discrete components;

however, in such instance the mixer will not use all the benefits provided in the fully integrated embodiment.

Figure 1:
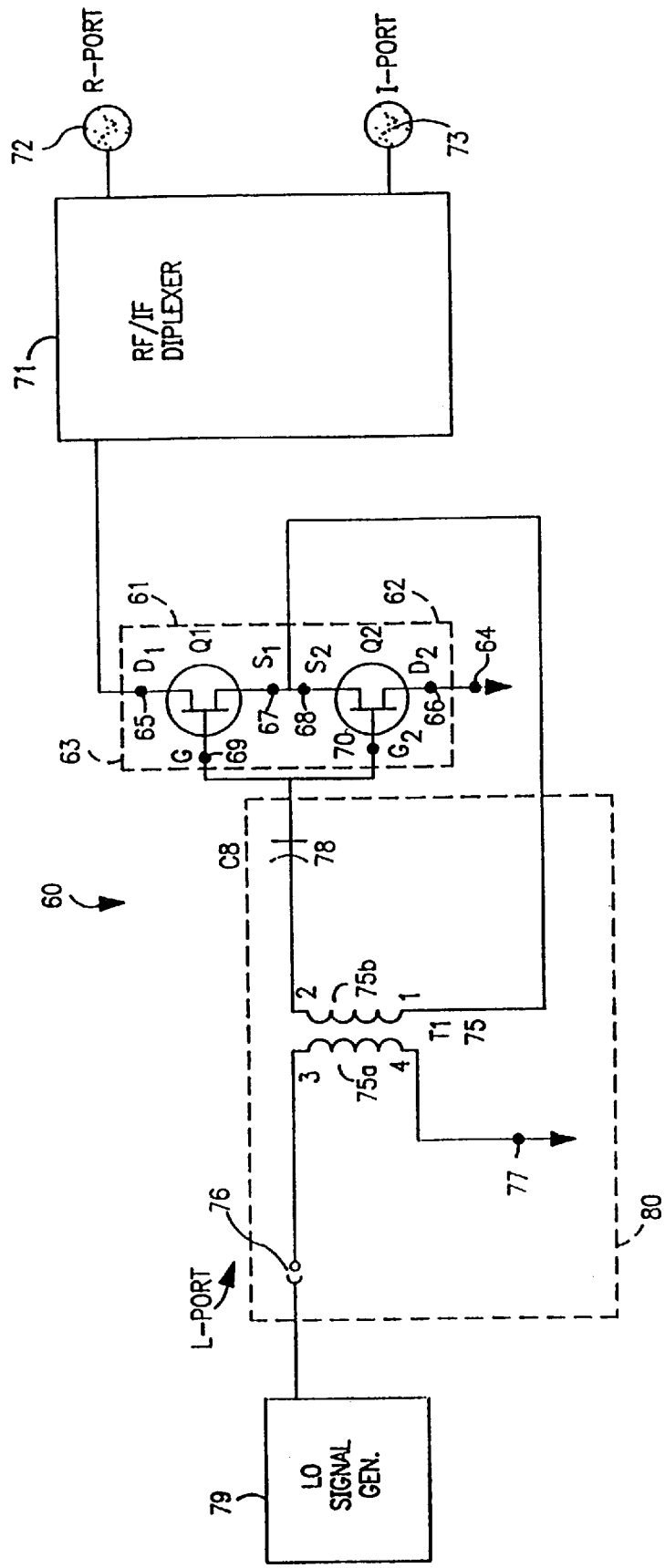
FIG. 1 is an illustration showing a first embodiment of the subject invention.

An exemplary embodiment of the inventive mixer 60 is now described relative to the exemplary embodiment in FIG. 1. One aspect of the invention lies in the use of a pair of serially connected switching elements, such as FETS Q1 (61) and Q2 (62) in order to achieve a back-to-back serially connected dual-FET structure 63 to attain advantages described in U.S. patent application Ser. No. 08/574,071 now U.S. Pat. No. , such a way that the Radio-Frequency (RF) and Intermediate-Frequency (IF) signals are not balanced, but instead are referenced to ground potential at ground node 64.

Each FET Q1, Q2 has drain terminals ($D_1$, $D_2$) 65, 66, source terminals ($S_1$, $S_2$) 67, 68, and gate terminals ($G_1$, $G_2$) 69, 70. Grounding is achieved by connecting one of the FET drain terminals, for example the drain terminal ($D_2$) of FET Q2 to ground, here designated by ground node 64. By connecting the drain terminal of one of the FET's to ground, and providing other structures described hereinafter, the need for both the conventional IF balun and RF balun is eliminated. Only a simple, compact, and fully integrable RF/IF diplexer 71 connects the drain D1 of Q1 to the R-port 72 and I-port 73. Furthermore, the performance of the inventive mixer structure is enhanced by its ability to cancel intermodulation distortion. Performance is not sacrificed, relative to conventional mixers, by eliminating either the RF or IF baluns.

Because the mixer structure 60 eliminates the IF balun, absent other compensating changes, the FET pair structure (Q1-Q2) 63 is in an unbalanced configuration. That is, the pair of FETs Q1 and Q2 are unbalanced but diplexer circuit 71, having only small inductors and capacitors, can be implemented on the integrated circuit chip; however, in order for the circuit to operate as intended and realize the distortion cancellation provided by the matched back-to-back FET pair 63, the common source terminal node ($S_1$–$S_2$) 67, 68 is allowed to float relative to ground such that it is no longer tied to ground.

With the Q2 drain node (D2) grounded, the common source node ($S_1$, $S_2$) should not also be grounded as might occur as the result of directly connecting a local oscillator drive to the FETs. Instead, a differential Local Oscillator (LO) drive signal is supplied between the jointed gate 69, 70 and jointed source 67, 68 terminals by providing a transformer T1 (75) having primary winding 75a on the transformer LO drive side and secondary winding 75b on the FET-pair side. The primary winding 75a has two terminal ends and is connected at each end between the LO drive input port 76 high side terminal and ground terminal 77, while the secondary winding 75b is connected at one end to the common FET source terminals ($S_1$, $S_2$) and to the common gate terminals ($G_1$, $G_2$) via capacitor C8 78. The transformer allows the LO drive signal from the secondary to float, since neither side of the secondary winding is grounded. Any conventional LO drive signal, such as a constant frequency sinusoidal signal provided by an external LO signal source 79, operating at the LO frequency ($f_{LO}$) may be used to generate the extra LO signal applied to the transformer primary.

A LO balun in the form of transformer T1, 75 is advantageously provided in the inventive structure, but such LO balun is easily integrable due to the high frequency of the LO signal. Aside from being integrable because the IF balun has been eliminated, a further advantage of the invention is that it also eliminates the RF balun with its associated loss, typically on the order of about 1–2 dB. RF balun is lossy so that elimination of the RF balun also advantageously results in a reduction of conversion loss and noise figure. The invention structure may be used on either an up-frequency connector in which case an IF input signal is injected into I port 73 and the RF output is extracted at R-port 72; or as a down connector in which the RF input is injected at R port 72 and the IF signal extracted at I-port 73.

The mixer configuration of the present invention is referred to as a totem-pole configuration because of the "vertical" structure in which the drain terminal $D_2$ of Q2 is tied to ground, the source terminal of Q2 (and the source terminal of Q1) extend above ground, and the drain terminal of Q1 is at an even higher potential relative to the grounded Q2 drain terminal so that the entire FET structure forms a stacked structure reminiscent of the totem pole structures of indigenous people of the North American continent. The term totem pole has also been used to describe an amplifier having a grounded terminal and intermediate amplification stages that provide intermediate voltages between ground and the higher power supply voltage.

If the LO drive circuit were ground referenced, there would conventionally arise an expectation to provide a balanced RF (or IF) signal to the FET pair 63. However, there was a realization that because the LO drive circuit driving the FET pair is not ground referenced, but rather floating relative to ground, the end FET drain 66 can instead be grounded without changing the currents that are flowing to and through the back-to-back FET structure 63. The currents to and through the FETs provide the desirable distortion cancellation as explained in greater detail elsewhere in this description. Ordinarily under the conventional wisdom, grounding one end of a floating balanced circuit would destroy operation, yet in the inventive configuration, the particular combination of structures retains the essential benefits of the FET-pair, including complete distortion cancellation.

In like manner to the signals described in U.S. patent application No. 08/574,071, the RF signal current that impinges on the FET-pair structure 63, impinges in a balanced manner with respect to the common FET source terminal ($S_1$, $S_2$) 67, 68, and therefore any distortion that occurs as a result of interaction with the first FET Q1 61 is canceled by the interaction of the same current with the second FET Q2 62, which tends to lead one to believe that a balanced RF must be provided to retain such benefits. However, the invention also provides the recited benefits when unbalanced signals are applied.

Figure 2A:
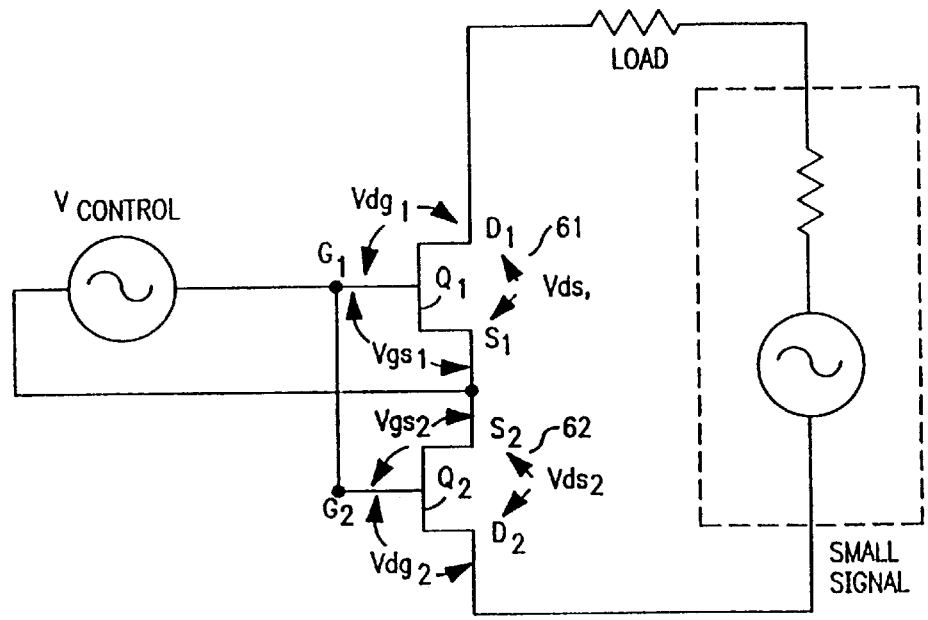
FIGS. 2A–2B are an illustration showing back-to-back serially connected FETs and the manner in which intermodulation distortion is suppressed.

FIG. 2 aids in illustrating how back-to-back FETs cancel intermodulation distortion in the mixer circuit 60. For the circuit of FIG. 2A, the gate-to-source voltages for each FET are equal and also equal to the FET control voltage. Furthermore, for each FET the SUM of the gate-to-source voltage and the source-to-drain voltage is equal to the gate-to-drain voltage. Therefore, $$Vg_1s_1 = V_{control}$$

$$Vg_2s_2 = V_{control}$$

$$Vg_1d_1 = Vg_1s_1 + Vs_1d_1$$

$$Vg_2d_2 = Vg_2s_2 + Vs_2d_2.$$

To a first approximation, $Vs_1d_1 = -Vs_2d_2$ where Vsld, is the source-to-drain voltage across transistor Q1, and $Vs_2d_2$ is the source-to-drain voltage across transistor Q2. Also, to a first approximation, $\Delta R_{ds} = c \times \Delta V_{gd}$, which says that the channel resistance across the drain-to-source channel ($\Delta R_{ds}$) is linear (to a multiplicative constant c) to gate bias voltage ($\Delta V_{gd}$). This assumption is nearly correct during the time that the FETs are heavily conductive. Note that the two FETs are ideally matched such that they behave the same, and let $Rd_1d_2$ be the total series resistance of the two FETs Q1 and Q2, and the change of channel resistance $\Delta Rd_1d_2$ be that component of the channel resistance causing intermodulation distortion. Then, $$\Delta Rd_1d_2 = c \times (\Delta Vg_1d_1 + \Delta Vg_2d_2) = c \times (Vs_1d_1 + Vs_2d_2) = 0$$

The small signal passes through the FET channel combination without controlling its resistance. This condition is equivalent to infinite intermodulation suppression. This is the technique used in mixer 60 to help reduce intermodulation distortion.

Aspects of distortion cancellation in series connected FETs is now described. When a signal voltage is applied to the drain of a FET, there exists a voltage $V_{ds} = V_{sig}$ across the channel of the FET. Regardless of the gate voltage, the channel resistance (and impedance) of the FET is not constant, but is modulated by the voltage $V_{sig}$. The result or effect of this process is nonlinearity distortion signals generated across the channel and appearing as a distortion voltage $V_{dist}$. Hence, the total voltage across the FET drain to source channel ($V_{ds}$) is the sum of the signal voltage ($V_{sig}$) plus the distortion voltage ($V_{dist}$); such that:

$$V_{ds} = V_{sig} + V_{dist}.$$

In general, the distortion signal can be separated into two distinct components. The first component is the "odd order" distortion voltage ($V_{dist,odd}$). It has the property of retaining the sign information of the signal voltage that caused it, whence:

$$V_{dist.odd}(-V_{sig}) = -V_{dist.odd}(V_{sig})$$

On the other hand, the "even order" distortion voltage ($V_{dist.even}$) does not retain the sign information, so that:

$$V_{dist.even}(-V_{sig}) = V_{dist.even}(V_{sig})$$

When two FETs are connected serially back-to-back, with their respective sources tied to one another and their respective gates tied to one another, a signal voltage $V_{sig}$ can be applied to the FET pair as a potential difference between the two drains D, and $D_2$. This results in the relationships:

$$V_{dc1} = V_{sig}/2$$

$$V_{dc2} = -V_{sig}/2$$

where $V_{ds1}$ is the drain-to-source voltage for the first FET and $V_{ds2}$ is the drain-to-source voltage for the second FET and the total voltage is split between the two. Taking the distortion components into account, the relevant voltages are:

$$V_{ds1} = B_{sig}/2 + V_{dist.odd}(V_{sig}/2) + V_{ist.even}(V_{sig}/2)$$

$$V_{dc2} = -V_{sig}/2 + V_{dist.odd}(-V_{sig}/2) + V_{dist.even}(-V_{sig}/2)$$

Utilizing the definitions of even and odd order distortion described above, it follows that:

$$V_{ds1} = V_{sig}/2 + V_{dist.odd}(V_{sig}/2) + V_{dist.even}(V_{sig}/2)$$

$$V_{ds2} = -V_{sig}/2 - V_{dist.odd}(V_{sig}/2) + V_{dist.even}(V_{sig}/2)$$

When this connection of FETs occurs in a mixer, the distortion that is coupled to the surrounding circuitry and to the output port of the mixer is the difference in potential between the two drains:

$$V_{ds1} - V_{ds2} = V_{sig} + [2 \times V_{dist.odd}(V_{sig}/2)]$$

Thus, in theory complete cancellation of the even order distortion can occur, while no cancellation of odd order distortion is obtained. These relationships hold irrespective of whether the FET drain $D_2$ is grounded or not.

Figure 2B:
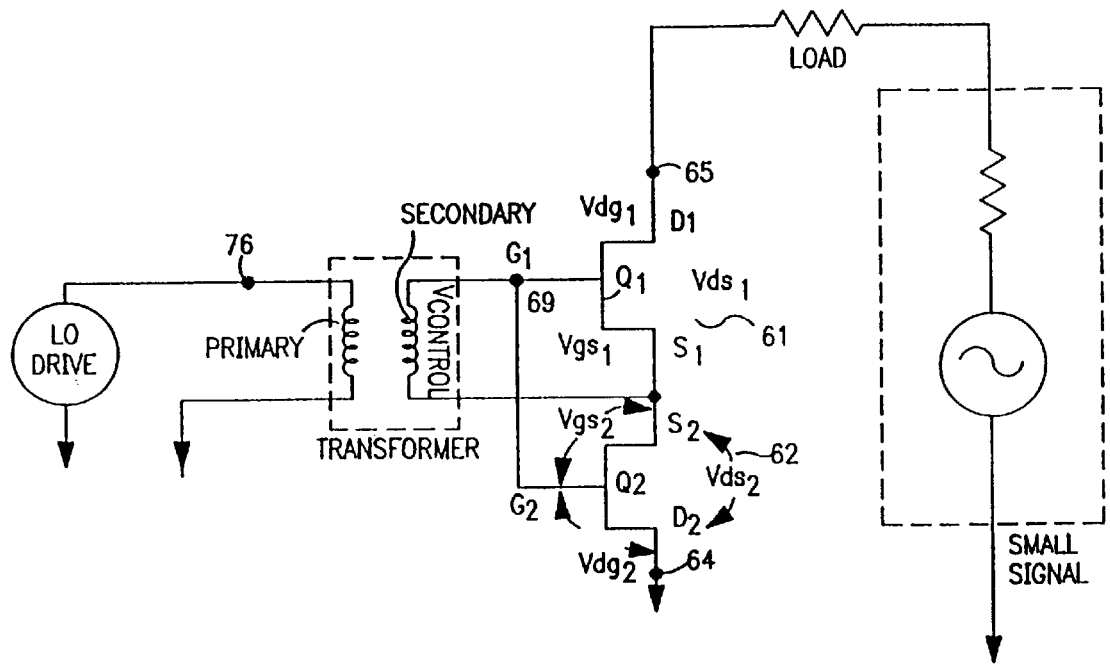

In the circuit of FIG. 2B, the grounded FET drain is shown in a circuit where the switching FETs are driven by a floating (non-grounded) LO drive signal. Except that one node (Q2 drain) is defined at ground, the analysis presented relative to the circuit in FIG. 2A is unchanged so that it is clear that cancellation also occurs for this totem pole FET configuration.

Several features of the invention follow directly from the FET-pair connectivity and voltage relationships. First, complete cancellation of intermodulation distortion requires that the distortion be generated in precisely equal magnitude within each of the two FET's, and summed in opposite directions to achieve the distortion cancellation. Where some slight variation in magnitude is present, such as might be present by normal device process variation, the distortion is reduced commensurate with the degree of matching.

Second, the generation of equal magnitude distortion by each transistor (FET) requires that the transistors have identical gate-source voltages ($V_{gs}$) at all times, that is during all phases of the control (e.g local oscillator) signal. This second condition is strictly true in the invention because the two FET's have common gate terminals and common source terminals, so that these terminal pairs are always at the same voltage potential independent of the absolute voltage potential or time.

Third, distortion cancellation also benefits from having the same drain-to-source ($V_{ds}$) voltage for the two FET's at all times. This condition also is present in the invention because the identical gate-to-source voltage ($V_{gs}$) results in the same channel resistance for the two FET's, which results in an identical voltage drop across the two FET channels.

Finally, the distortion produced by each of the two FETs 67, 62 operating as a pair is summed by means of the back-to-back serial connectivity between the two FETs, so that the distortion is canceled. This condition is met in the invention by the common source connection of the two FETs, and by the connection of the two drains of the FET pair to the mixer ports.

Those workers having ordinary skill in the art will realize in light of this disclosure that while each of the exemplary embodiments show Field-Effect Transistors (FETs), other switching devices such as diodes, Bipolar transistors, and the like may be used. When two terminal diodes are substituted, certain minor modifications to the circuits will be required. Further that even when FETs or Bipolar transistors are used, such transistors may be connected source-to-source, drain-to-drain, or drain-to-source; and that n-channel, p-channel, and other conventional device structures may be employed; and still benefit from the inventive principles.

Having now described the theoretical basis for intermodulation distortion cancellation in the FET-pair, we now describe details of the operation of switching network 63 in the context of the mixer 60.

Other embodiments of the inventive mixer are now described which include the important features already described as well as additional features that while not required, are advantageous for particular mixer applications or improve performance generally.

Figure 3:
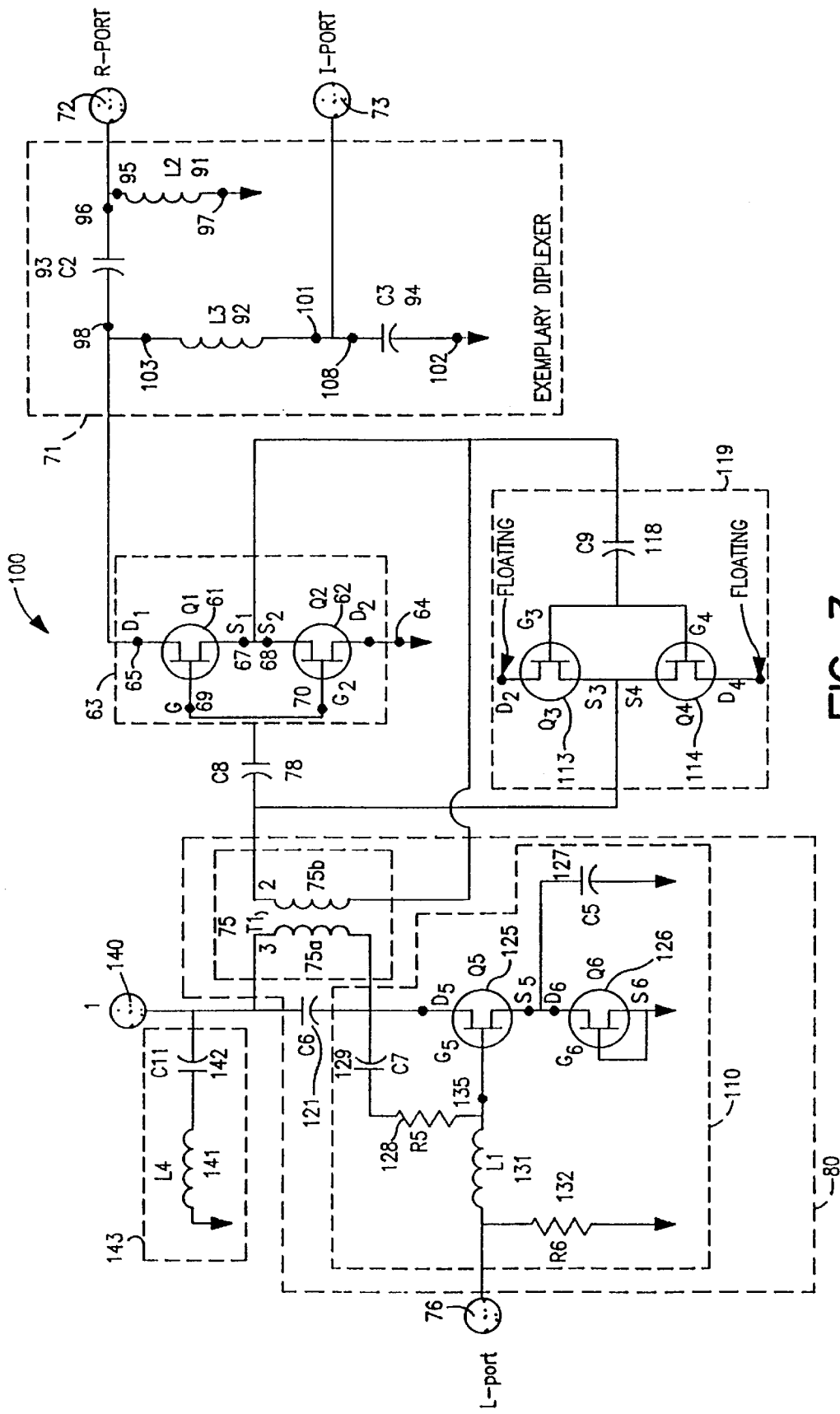
FIG. 3 is an illustration showing a second embodiment of the subject invention having additional optional elements including a local oscillator amplifier and compensating drone FETs.

With respect to the embodiment illustrated in FIG. 3, Q1 and Q2 are a pair of FETs and are the heart of mixer 100. Like numbered elements in FIGS. 3 and 1 correspond to like structures in each embodiment. Methods for fabricating multiple FETs on a common substrate so that they have matched characteristics is known and not described further; however, although the invention is particularly well suited to monolithic implementations where it's advantages are particularly apparent, the invention is not limited only to common substrate or monolithic implementations, or to situations when the switching elements (e.g FETs) are precisely matched, rather some modest degree of mismatch may be tolerated for less critical applications if only partial intermodulation distortion cancellation is tolerable.

During operation, the RF and IF signal currents flowing into the drain ($D_1$) of Q1 must also flow into the source terminal ($S_2$) of Q2 because all other connections to the common source node ($S_1$, $S_2$) and the common gate node ($G_1$, G2) are to floating structures and provide no encouragement for signal current flow, whereas the RF and IF signal currents must return to ground, and the floating structures do not provide a return path to ground.

Because the RF and IF signals flow into the Q1 drain, out the Q1 source, into the Q2 source, and out the Q2 drain, much or all of the nonlinearity distortion generated in Q1 is also generated in Q2, but with reverse or opposite sign, owing to the reverse connection (source-to-source) of Q2 relative to Q1. That is current which traverses Q1 from drain-to-source necessarily traverses Q2 from source-to-drain. Given this reverse FET connection, intermodulation distortion is canceled, thereby resulting in substantially higher third order intercept point for the mixer 100. The manner in which distortion is canceled has been described earlier relative to FIG. 2. For closely matched FETs the degrees of cancellation is related to the closeness of the match. For matched FETs, such as would be obtained during simultaneous fabrication on a common semiconductor substrate, the cancellation is substantially complete, if not absolutely complete.

In exemplary embodiments of the mixer 60, 100, (such as the embodiment having the particular structure and component values illustrated in FIG. 3 and Table I) the third order intercept point (a commonly acknowledged indicator of mixer performance) is about 32 dBm. This compares to a third order intercept point from about 22 dBm for conventional configurations under similar LO drive power levels.

The "totem pole" is formed by the grounded serial combination of Q1 and Q2 and operates on unbalanced RF and IF signals. The illustrative inventive structure grounds the drain of Q2, and feeds RF and IF signals to and from the FETs in unbalanced fashion. Its ability to operate well on unbalanced RF and IF signals alleviates any need for RF baluns or IF baluns, although the inventive structure and method do not preclude operation with balanced RF and/or IF signals, or operation with RF and/or IF baluns.

Since IF signals for a mixer are traditionally low frequency, in a conventional implementation the IF balun is required to be large and is therefore not integrable in a monolithic structure. Any RF balun would operate at a higher frequency and would in theory, be somewhat more easily integrable, but still undesirable in a practical sense. Therefore, both baluns are advantageously eliminated.

With this grounded dual-FET totem pole structure 63, the common Q1–Q2 source and common Q1–Q2 gate nodes are nominally at a potential that is one-half the potential of the RF and IF juxtaposition waveform. It is therefore incumbent on the LO drive circuit 80, including external LO signal generator 79, transformer T1 75, and capacitor C8 (78) to provide a floating LO drive output which will be connected between the Q1–Q2 common gate and common source terminals of the totem pole so as to switch FETs Q1 and Q2 to ON and OFF conduction states during respective cycles of the LO drive signal. This LO drive floating output requirement prevents RF and/or IF currents from exiting the common source nodes ($S_1$, $S_2$) of the Q1–Q2 dual-FET totem pole, which would upset the balance of current in Q1 and Q2 and therefore prevent the desired distortion cancellation of currents in the Q1-Q2 FET pair. (Optional enhancements to the mixer are described subsequently that further control or suppress signal leakage for the common source node.)

The floating output is achieved with transformer T1 (75). In a monolithic wafer implementation, transformer T1 is realized as a pair of interleaved spiral inductors 75a, 75b, each functioning as one of the primary and secondary transformer windings. In an exemplary embodiment of the circuit illustrated in FIG. 3, transformer T1 is implemented as a 448 micron×448 micron structure having 13 micron wide lines and 9 micron wide spaces. An exemplary set of parameters are provided for each inductive element including transformers in the attached Tables which generally indicate an area in which one or more traces and spaces are provided, the length and width of such traces and spaces, and where appropriate the number of turns or coils. Those workers having ordinary skill in the art will appreciate that these are only examples and that other equivalent structures may be implemented.

The structure and operation of a embodiment of the invention having been described relative to the structure illustrated diagrammatically in FIG. 1, we now turn our attention to a second embodiment which further includes additional structures that have an advantageous influence on performance for certain mixer applications.

This second embodiment of the inventive mixer structure is now described relative to FIG. 3. In this exemplary embodiment, a standard diplexer 71 is comprised of inductors L2 (91) and L3 (92), and capacitors C2 (93) and C3 (94). Diplexer 71 is used to separate RF and IF frequency signals at R-port 72 and I-port 73, referenced to ground. The R-port 72 receives an externally applied RF signal and outputs an IF signal at I-port 73 when the mixer is operated as an RF-to-IF converter (down-converter). Alternatively, the mixer 100 receives an IF-signal as an input at the I-port 73 and outputs an RF signal at the R-port 72 when operated as an IF-to-RF converter (up-converter).

R-port 72 is connected to the drain ($D_1$) 65 of FET Q1 via the common node connecting the serial connection of capacitor C2 93 with inductor L2 92 which are directly joined a respective first terminals 95, 96, where the second terminal 97 of inductor L2 is grounded and the second terminal 98 of capacitor C2 is connected directly to the Q1 drain 65. The I-port 73 is also connected to the drain (D,) terminal 65 of FET Q1 via the common node of the serial combination of capacitor C3 94 and inductor L3 92 which are joined at respective first terminals 100, 101, where the second terminal 102 of capacitor C3 is connected to ground and the second terminal 103 of inductor L3 is connected to the drain ($D_1$) 65 of Q1 and also to the second terminal 98 of capacitor C2 93.

In the exemplary embodiment of the invention, C2 is a 2.58 pF capacitor, C3 is a 6.69 pF capacitor, L2 is a monolithic inductor occupying a __micron x__ micron region and formed with 13 micron wide lines and 9 micron wide spaces, and L4 is a line having dimensions 278 microns×13 microns to approximate an inductor. Inductors and transformers are formed as rectangular spiral structures (linear segments with substantially ninety degree corners) within the designated rectangular region and are wound to nearly completely fill the allocated region. (The transformer, inductors, and capacitors were simulated using the SONET EM field simulation program from which electrical component values may be determined from monolithic circuit parameters such as trace length, width, and spacing, or monolithic dimensions may be determined from desired circuit component values.)

Transistors Q3 (113) and Q4 (114) are advantageously provided in the LO drive circuit and serve to symmetrize the nonlinearity of the gate-to-source capacitance $C_g$, of Q1–Q2 by means of replication of the capacitance and reverse superposition of the replicated capacitors (Q3–Q4) with the capacitance of the FET switches (Q1–Q2). Serving no other purpose than to symmetrize the nonlinearity of the gate-to-source capacitance $C_{gs}$ of Q1–Q2, FETs Q3–Q4 are referred to as "drone FETs". Note that because drone FETs Q3 and Q4 are advantageously formed at the same time, with the same process, and on the same substrate as Q1 and Q2, their electrical and physical properties are substantially matched if not identically matched to the electrical and physical properties of Q1 and Q2. Therefore the gate-to-source capacitances ($C_{gs3}$ and $C^{gs4}$) of Q3 and Q4 are equal to those of Q1 and Q2. It is noted that Q3 and Q4 also share a common source terminal and a common gate terminal, and that the drain terminals of both Q3 and Q4 float relative to ground. However, the phase of the local oscillator signal that drives the FET's Q1–Q2 gates is connected to drive the Q3–Q4 sources so that reverse superposition is applied to effect the desired compensating cancellation.

Because Q1–Q2 are matched to Q3–Q4, the reverse superposition completely symmetrizes the gate-to-source capacitance $C_{gs}$ of Q1–Q2. The total capacitance deviation ($\Delta$cgs) of the total ensemble of Q1–Q4 as LO drive signal proceeds through one full cycle is an even function of Vgs. The cumulative capacitance of Q1–Q4 is more stationary with respect to Vgs compared to any of Q1, Q2, Q3, or Q4 because when the pair Q1–Q2 are at maximum, the pair Q3–Q4 are at a minimum and when they sum together the effective total is more nearly constant than with any one or pair alone. Furthermore, the peak-to-peak deviation is smaller. The capacitance in the combination Q1–Q4 is both more symmetric and more stationary. This effect is highly advantageous since a tuned resonant circuit anticipates and functions best with a constant value, or more nearly constant value, of capacitance.

In this circuit structure of FIG. 3, capacitors C8 (78) and C9 (118) are advantageously added to provide dc blocking functions so that forward biasing of the gate junctions of Q1, Q2, Q3, and Q4 is avoided. By charging up to a voltage of sufficient magnitude capacitors C8 and C9 facilitate self biasing of the aforementioned FETs.

The structure, operation, and advantages of the particular LO drive circuit 110 are now described with further reference to FIG. 3. The gate-to-source capacitance deviation ($\Delta$C) relative to the nominal value of $C_{gs}$ (from $C_{gs1}$ and $C_{gs2}$) owing to the gate-to-source voltage variation ($\Delta V_{gs}$) from its nominal DC value (Vgs) of each of Q1 and Q2 is largely an odd function of the deviation of the gate-to-source voltages of Q1 and Q2 about the DC value of this gate-to-source voltage. In other words $\Delta c_{gs}$ is an odd function of $\Delta V_{gs}$. This circumstance adds to the difficulty of driving the FETs with a resonance tuned LO amplifier because the changing capacitance acts to distort the sinusoidal waveform in an asmetrical manner.

The optional LO drive circuit 110 is double tuned, in that the primary winding 75a (LO drive side) of transformer T1 has first parallel resonance with capacitances C6 121 and the gate-to-drain capacitance ($C_{gd}$) and the drain-to-source capacitance ($C_{ds}$) of Q5 125, and the secondary winding 75b (dual-FET pair side) of transformer T1 has second parallel resonance with the cumulative capacitance value of Q1, Q2, Q3, and Q4. As such, the circuit may advantageously be tuned to operate over a specific band of LO frequencies.

The structure and operation of optional LO drive amplifier 110 is now described. Transistor Q5 125 is biased by transistor Q6 126. Both the gate ($G_6$) and source ($S_6$) terminals of Q6 are joined together and grounded. Q6 typically operates at it's $I_{dss}$ current which is scaled to be about 40% of Q5's $I_{dst}$ current. The Q5 $I_{dss}$ current is selected so that adequate signal gain is achieved without excessive loading capacitance or bias current requirement. However, a wide range of operating current will work, perhaps with loss of efficiency in power utilization. For example, Q6 operation in the range of 25% to 100% of Q5's $I_{dss}$ current may be used.

Capacitor C5 127 provides the source terminal ($S_5$) of Q5 with an AC ground but blocks DC current. Resistor R5 128 is a traditional feedback resistor that is provided to improve input impedance match and to adjust the gain of amplifier 110. Capacitor C7 129 is a DC blocking capacitor which permits the use of resistor R5 (as described) without upsetting the DC bias of transistor Q5. In one embodiment of the inventive circuit the impedance is matched to 50 ohms, but the components may be modified to match to other external impedances.

Inductor L1 131 is an input matching inductor connected between LO input 76 and the Q5 gate terminal 135, that contributes to the input matching. Resistor R6 132 connected between LO input 76 and ground keeps the gate of QS at DC ground. A bias port 140 is also provided. Inductor L4 141 and capacitor C11 142 comprise an optional bias-port bypass resonator circuit 143 which holds the bias port 140 at AC ground regardless of the impedance of the external bias source circuit.

Exemplary component values are identified in Table I for the circuit in FIG. 3, which parameters provide operation for LO frequencies in the range generally from about 1400 Mhz to about 2000 Mhz. Similarly the RF frequency range is generally from about 1700 Mhz to about 2000; while the IF frequency range is generally from about 10 Mhz to about 250 Mhz, and more typically from about 100 Mhz to about 250 Mhz. Therefore for this configuration, the LO and RF frequency ranges may overlap. However it will be appreciated by those workers having ordinary skill in the art in light of the disclosure provided herein that the frequency range for operation of the inventive structure or mixing method is not limited to the particular range recited above, and that in general frequencies in the range from audio signal frequencies through 10's of gigahertz may be used with suitable selection of comonent values. Furthermore, although use of the particular diplexer circut operates to separate incomming signal from reflected signal within the mixer such that the frequencies of the IF do not overlap with the LO or RF other structures may be substituted to provide or tolerate such overlap. For example, instead of diplexers (of which there are many conventional types which may be used), a circulation separator, a directional coupler, or any other apparatus, circuit, or method that can detect and stear the waves can be used in conjunction with the inventive circuit.

The foregoing describes the basic circuit structure (see for example FIG. 1) and operation as well as a second embodiment (see FIG. 3) including additional optional features. Other changes may be made to the circuit in order to enhance various characteristics of performance and cost. These alternative embodiments are described relative to the embodiments illustrated in FIGS. 4–8 below.

Figure 4:
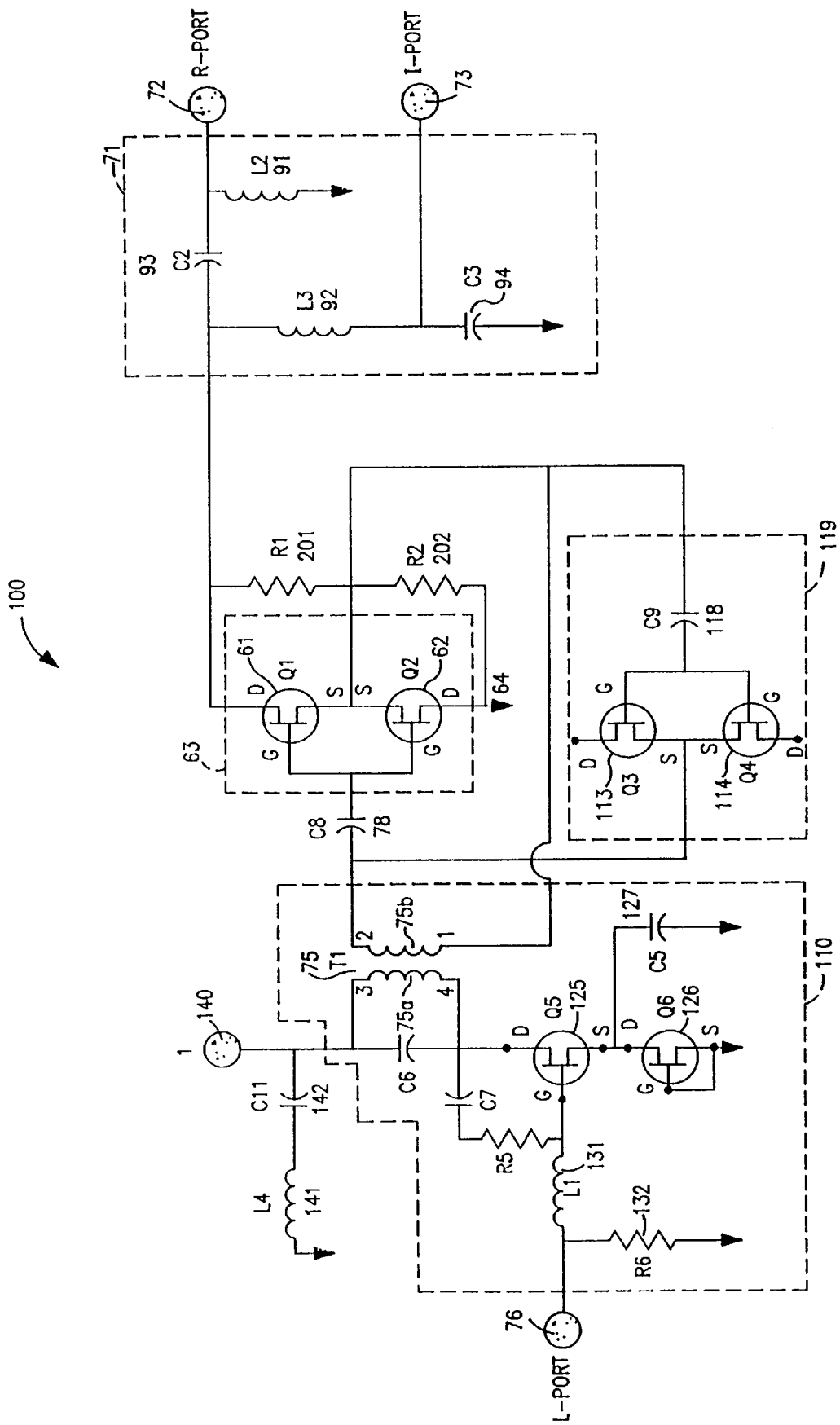
FIG. 4 is an illustration showing a third embodiment of the subject invention having additional optional elements including a local oscillator amplifier and compensating FETs and resistors which reinforce the symmetry of operation of the mixer FETs.
Figure 5:
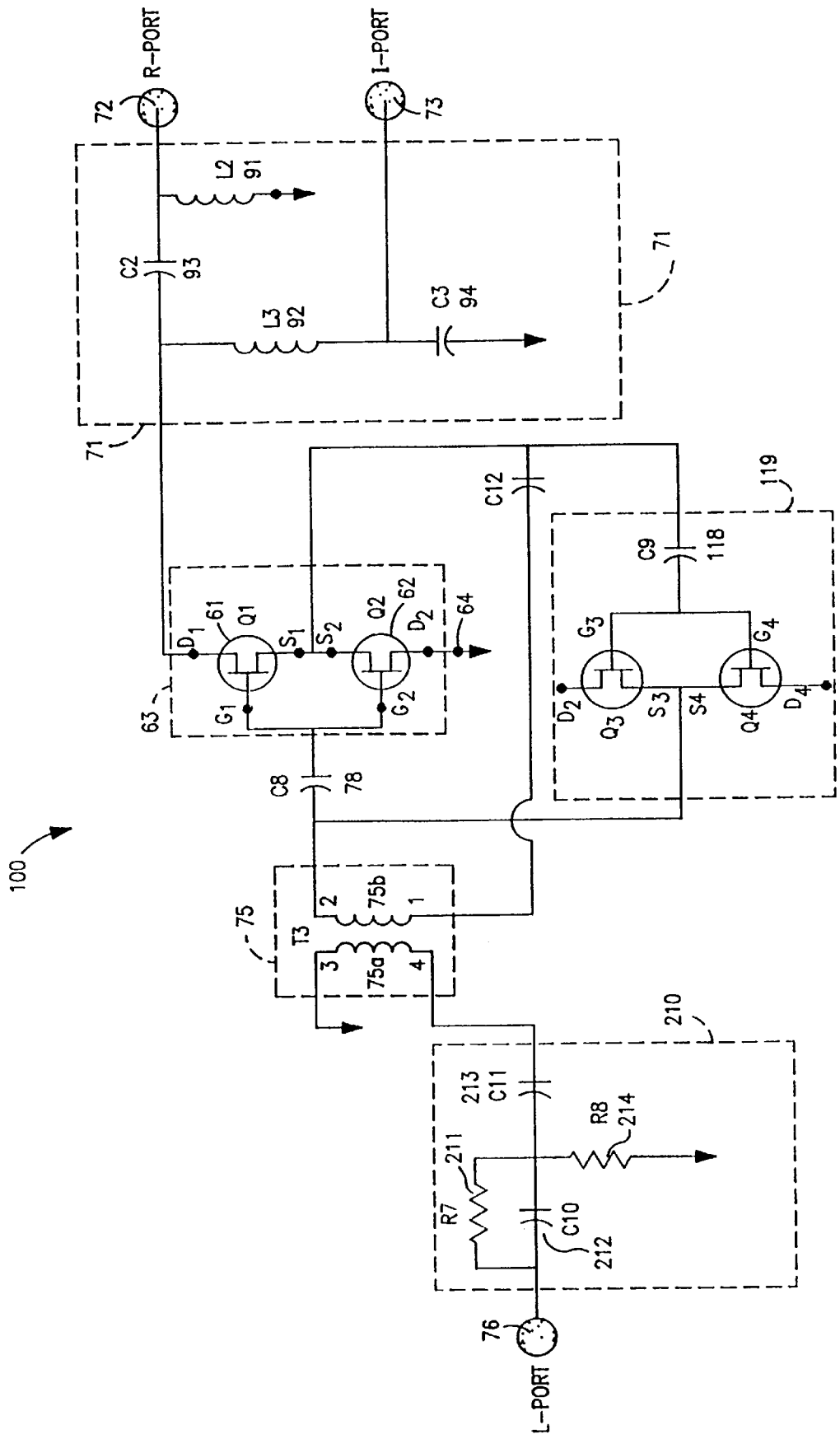
FIG. 5 is an illustration showing a fourth embodiment of the subject invention having additional optional elements including a local oscillator input matching network and compensating FETs.
Figure 6:
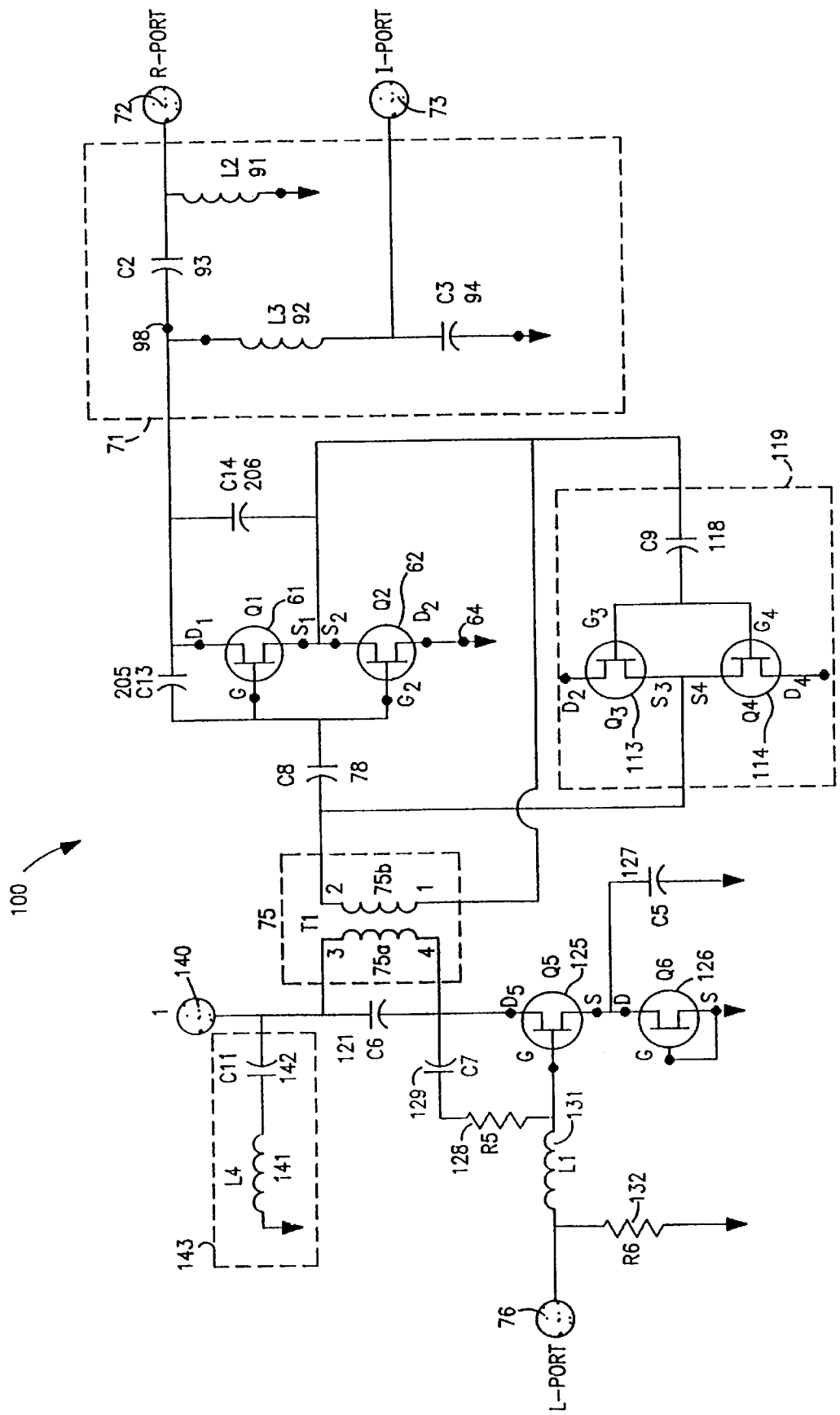
FIG. 6 is an illustration showing a fifth embodiment of the subject invention having additional optional elements including a local oscillator amplifier, compensating drone FETs, and capacitors to compensate for possible transformer capacitive coupling to ground.
Figure 7:
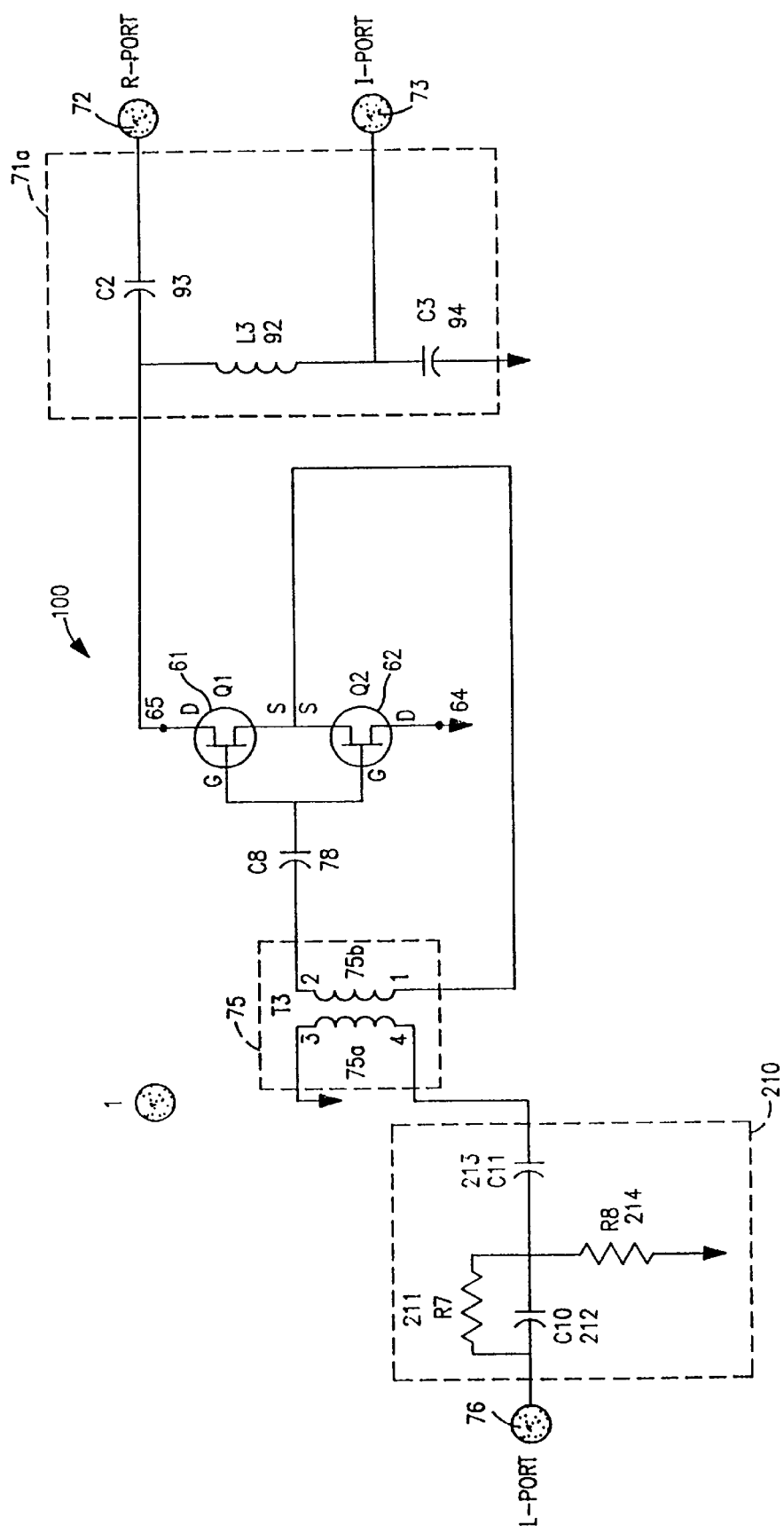
FIG. 7 is an illustration showing a sixth embodiment of the subject invention that eliminates the local oscillator amplifier, compensating drone FETs, transformer compensating capacitors, and symmeterizing load resistors, and includes other modifications.
Figure 8:
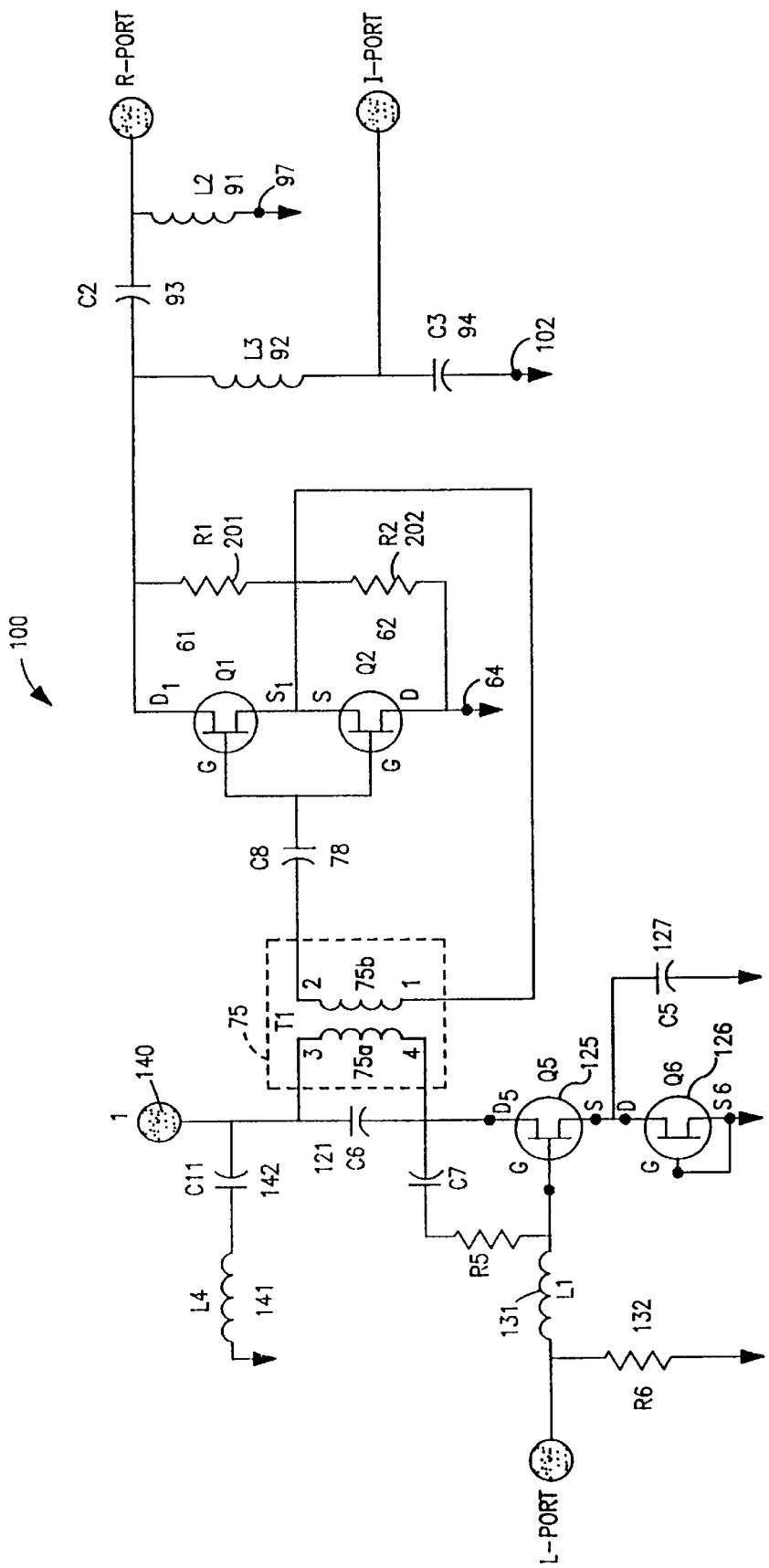
FIG. 8 is an illustration showing a seventh embodiment of the subject invention having the local oscillator amplifier and symmeterizing resistors.

For example, mixer performance may be improved by adding optional resistors R1 201 and R2 202 to the circuit to reinforce the symmetry of operation of Q1–Q2 relative to the embodiment in FIG. 4; a LO input matching network 210 may be provided to replace the LO amplifier circuit 110 as illustrated and described relative to the embodiment in FIG. 5; optional compensation capacitors C13 205 and C14 206 may be added to the circuit to cancel transformer 71 parasitic capacitance and assist in preserving the distortion cancellation behavior of the totem pole as illustrated and described relative to the embodiment in FIG. 6; and the drone FETs (Q3 and Q4) may be eliminated with (see FIG. 7) or without concurrent elimination of the LO drive amplifier 110, biasport bypass resonator 143, and symmetrizing resistors R1 and R2 (see FIG. 8). Those workers having ordinary skill in the art in light of the disclosure provided herein will appreciate that other permutations and combinations of optional mixer components may be selected.

With respect to the embodiment in FIG. 4, resistors R1 201 and R2 202 have been added to reinforce the symmetry of operation of Q1–Q2. Resistor R1 is connected across the drain and source of Q1, while resistor R2 is connected across the source and drain of Q2. A typical value for each of R1 and R2 is 200 ohms. Symmetry of operation of Q1–Q2 is reinforced by these resistors because their presence deemphasizes any leakage of signal current from the Q1–Q2 FET drain terminals so that current flowing through the Q1 channel also flows through the Q2 FET channel and not out the source terminal to cause a lesser degree of distortion cancellation. More particularly, R1 and R2 function to place a large load across each FET that is so substantial that the FET is effectively desensitized to the parasitic admittance of the transformer that places a load on the FETs. Of course a more complex network load could replace the resistors so that even more precise adjustment might be obtained. The netwok (e.g resistors R1 and R2 are provided such that each FET has a much higher admittance than the parasisit admittance of the transformer so that the parasitic admittance is small by comparison to the admittance of R1 and R2 and much less influential. Exemplary circuit component values for the structure in FIG. 4 are specified in Table II.

With respect to the embodiment in FIG. 5, the secondary winding 75b of transformer T1 75 is ideally floating, but in practice may have a small amount of capacitive coupling ($C_{T21}$) to the primary winding 75a, and hence to ground. This capacitive coupling can be modeled as two small parasitic capacitors; a first capacitor ($C_{T1}$) connected from common gate ($G_1$, $G_2$) of the totem pole FETs to ground and the second capacitor ($C_{T2}$) connected from common source ($S_1$, $S_2$) of the totem pole to ground. For this reason, it is advantageous to explicitly connect a compensating capacitor C13 205 from the common gate to the drain of Q1, and a second compensating capacitor C14 206 from the common source to the drain of Q1. The values of C13 and C14 are chosen to compensate for parasitic capacitances ($C_{T1}$ and $C_{T2}$) so that they cancel the effects of the transformer parasitic capacitance referred to earlier, and help to preserve the distortion cancellation behavior of the totem pole. Of course a different, and/or more complex compensation network or means may be provided instead of the capacitors C13 and C14 that more nearly replicates the parasitics of transformer T1 (typically a transformer appears as a resistor and phase angle), and by so doing, grants greater freedom to accomplish the desired compensation goals. Exemplary circuit component values for the structure in FIG. 6 are specified in Table III.

With respect to the embodiment of the mixer illustrated in FIG. 5, the LO amplifier 110 of the FIG. 3 embodiment only serves to reduce the required external input LO drive. Therefore, the amplifier 110 may be eliminated by instead providing a LO drive matching network 210 according to the schematic in FIG. 6, which shows one possible LO input matching network 210 comprising resistors R7 211, R8 214, and capacitors C10 212 and C11 213. The LO input matching network 210 is effective in replacing the LO amplifier 110, such as shown and described relative to FIGS. 3–4 so long as the LO input power applied at the LO input 76 is increased to account for loss of amplification. Of course the LO input matching network 210 may be used alone or in combination of the other enhancements to the basic circuit and other LO input matching circuit designs may be used. Exemplary circuit component values for the structure in FIG. 5 are specified in Table IV.

With respect to the embodiments in FIGS. 7 and 8, as stated earlier, the drone FETs are not essential to operation of the invention, and can be eliminated according to schematics illustrated in FIGS. 7 and 8.

The structure illustrated in FIG. 7 is comparable to the structure shown and described relative to FIG. 6, except that the drone FETs, Q3 and Q4 have been eliminated. In each instance, Capcitors (either C9 or C21) are in the circuit between source and gate terminals of the mixing FETs Q1 and Q2, but their capacitive values are different as indicated in the Tables accompanying the figures. The structure illustrated in FIG. 8 is similar to the structure shown and described relative to FIG. 3, except that the drone FETs Q3 and Q4 have been eliminated, and symmeterizing resistors R1 and R2 added as already described relative to FIG. 4. Exemplary circuit component values for the structure in FIG. 7 and 9 are specified in Tables V and VI.

Figure 9:
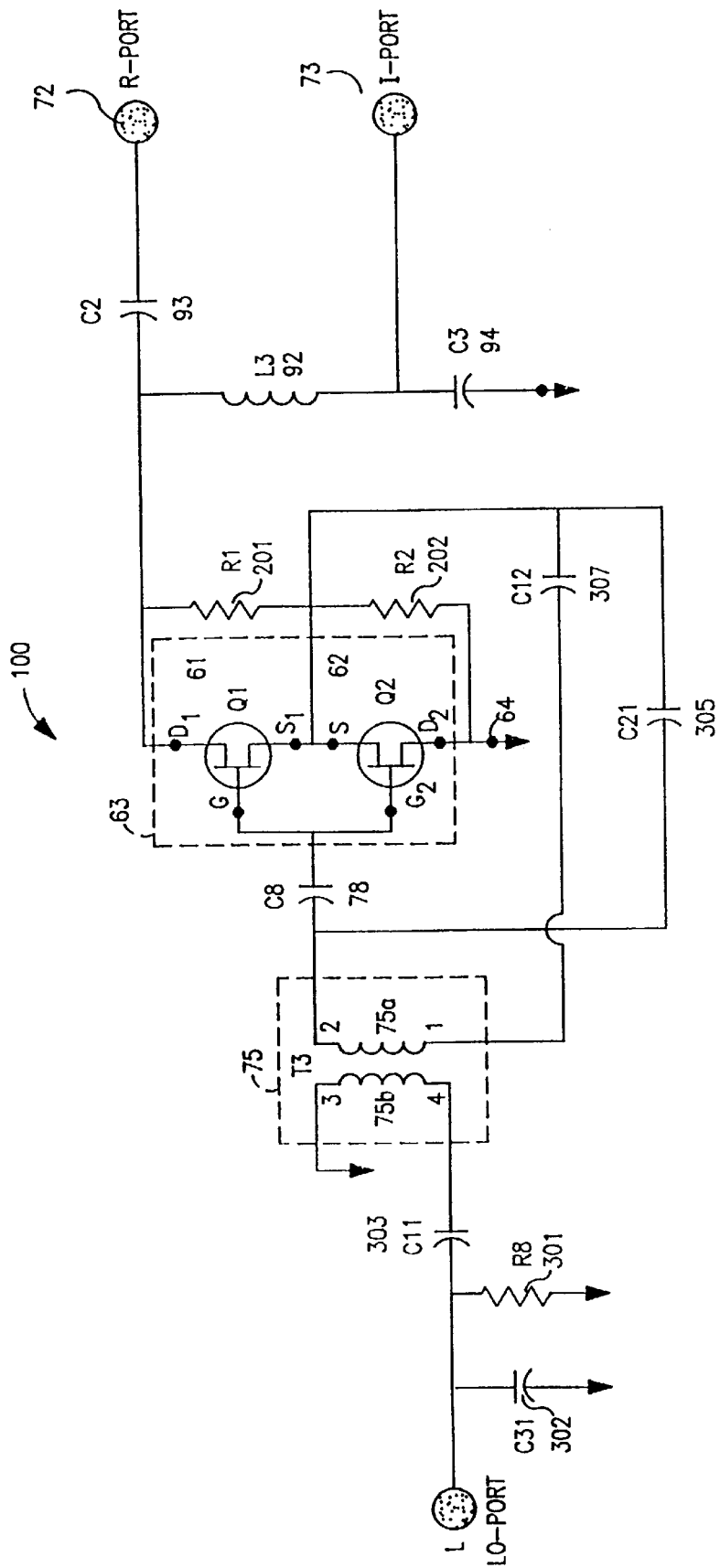
FIG. 9 is an illustration showing an eighth embodiment of the subject invention having the symmeterizing high load resistors and a different LO input circuit.

In FIG. 9, there is shown an additional embodiment of the inventive mixer which is similar to the embodiment in FIG. 7, except that the mixer in FIG. 9 also includes resistors R1 and R2, and also has a different resistor R8 and capacitor C31 between the L-port and capacitor C11. It is noted that capacitor C21 has been retained to restore the capacitance lost by the capacitance in Q3 and Q4 (removed from this embodiment of the circuit), thereby eliminating the need to entirely redesign the circuit. With respect to Capcitors C12 and C8, it is sufficient that there be at least one capcitor serially connected between the common gates and common drains, but this capcitor can be on either side of the trasnformer, and the presence of more than one capcitor in the circuit (e.g. C8 and C12) is merely a convenience resulting from the design history of the particular exemplary circuit.

In view of these alternative embodiments, it will be understood that components important to the invention are the totem pole configuration of switching elements (such as for example, FETs Q1 and Q2) and isolation means (such as for example isolation transformer Ti). Components that represent embellishments to the basic invention are the additional compensation structures implemented by resistors R1 and R2, or by capacitors C13 and C14, or by drone switching elements Q3 and Q4 that compensate for for the characteristics of Q1 and Q2. The additional pair of FETs (Q3 and Q4) is used to symmetrize the nonlinear capacitance (Cgs) of the principle transistors (Q1 and Q2), making them easier to drive by a resonant tuned amplifier and improving the symmetry of the resulting gate drive waveform, are also novel in a mixer circuit. Other components may be provided to support the basic elements, provide improved performance, and support the basic elements. These other components may be replaced with a variety of equivalent conventional circuit structures known in the art. Each of the exemplary mixer circuits provide a method of mixing signals for up-conversion or down conversion.

As compared to the aforementioned M/A-COM mixer described in the Background of the Invention, the subject of this disclosure has demonstrated third order intercept points in the low +30 to +35 dBm region which is superior to the +18 dBm performance purported to have been achieved by the M/A-COM mixer products using different circuit structure and operation.

The references described throughout this specification are fully incorporated by reference. Having now fully described the invention, it will be apparent to one of ordinary skill in the art that many changes and modifications can be made thereto without departing from the spirit or scope of the invention as set forth herein.

TABLE I

| Component Name | Component Value |
|---|---|
| Q1 | (6 × 100) × 1.0 μm |
| Q2 | (6 × 100) × 1.0 μm |
| Q3 | (6 × 100) × 1.0 μm |
| Q4 | (6 × 100) × 1.0 μm |
| Q5 | (4 × 150) × 1.0 μm |
| Q6 | (2 × 120) × 1.0 μm |
| R5 | 400 Ω (thin film resistor) |
| R6 | 200 Ω (thin film resistor) |
| R | RF port |
| I | IF port |
| L | LO port |
| 1 | Bias port 1 |
| C2 | 2.58 pF |
| C3 | 6.69 pF |
| C5 | 16.13 pF |
| C6 | 2.50 pF |
| C7 | 5.03 pF |
| C8 | 20.08 pF |
| C9 | 20.08 pF |
| C11 | 41.63 pF |
| L1 | 338 μm × 338 , 4.75 turns |
| L2 | 378 μm × 378 μm, 5.5 turns |
| L3 | 533 μm × 378 μm, 5.5 turns |
| L4 | {278 μm × 10 μm} line |
| T1 | TRANSFORMER 1 "N6L450" (448 μm × 448 μm), Primary 3.0 turns, Secondary 3.0 turns |

TABLE II

| Component Name | Component Value |
|---|---|
| Q1 | (6 × 100) × 1.0 μm |
| Q2 | (6 × 100) × 1.0 μm |
| Q3 | (6 × 100) × 1.0 μm |
| Q4 | (6 × 100) × 1.0 μm |
| Q5 | (4 × 150) × 1.0 μm |
| Q6 | (2 × 120) × 1.0 μm |
| R1 | 200 Ω (thin film) |
| R2 | 200 Ω (thin film) |
| R5 | 300 Ω (thin film) |
| R6 | 200 Ω (thin film) |
| R | RF port |
| I | IF port |
| L | LO port |
| 1 | Bias port 1 |

TABLE II-continued

| Component Name | Component Value |
|---|---|
| C2 | 2.58 pF |
| C3 | 6.69 pF |
| C5 | 16.13 pF |
| C6 | 2.02 pF |
| C7 | 5.03 pF |
| C8 | 20.08 pF |
| C9 | 20.08 pF |
| C11 | 41.63 pF |
| L1 | 338 μm × 338 μm, 4.75 turns |
| L2 | 378 μm × 378 μm, 5.5 turns |
| L3 | 533 μm × 378 μm, 5.5 turns |
| L4 | {278 μm × 10 μm} line |
| T1 | TRANSFORMER 1 "N6L450" (448 μm × 448 μm), Primary 3.0 turns, Secondary 3.0 turns |

TABLE III

| Component Name | Component Value |
|---|---|
| Q1 | (6 × 100) × 1.0 μm |
| Q2 | (6 × 100) × 1.0 μm |
| Q3 | (6 × 100) × 1.0 μm |
| Q4 | (6 × 100) × 1.0 μm |
| Q5 | (4 × 150) × 1.0 μm |
| Q6 | (2 × 120) × 1.0 μm |
| R5 | 400 Ω (thin film) |
| R6 | 200 Ω (thin film) |
| R | RF port |
| I | IF port |
| L | LO port |
| 1 | Bias port 1 |
| C2 | 2.58 pF |
| C3 | 6.69 pF |
| C5 | 16.13 pF |
| C6 | 2.73 pF |
| C7 | 5.03 pF |
| C8 | 20.08 pF |
| C9 | 20.08 pF |
| C11 | 41.63 pF |
| C13 | 0.75 pF |
| C14 | 0.50 pF |
| L1 | 338 μm × 338 μm |
| L2 | 378 μm × 378 μm |
| L3 | 533 μm × 378 μm |
| L4 | {278 μm × 10 μm} line [2] |
| T1 | TRANSFORMER 1 "N6L450" (448 μm × 448 μm) |

TABLE IV

| Component Name | Component Value |
|---|---|
| Q1 | (6 × 100) × 1.0 μm |
| Q2 | (6 × 100) × 1.0 μm |
| Q3 | (6 × 100) × 1.0 μm |
| Q4 | (6 × 100) × 1.0 μm |
| R7 | 15 Ω (thin film) |
| R8 | 150 Ω (thin film) |
| R | RF port |
| I | IF port |
| L | LO port |
| 1 | Bias port 1 |
| C2 | 2.58 pF |
| C3 | 6.69 pF |
| C8 | 20.08 pF |
| C9 | 20.08 pF |
| C10 | 5.15 pF |
| C11 | 2.70 pF |

TABLE IV-continued

| Component Name | Component Value |
|---|---|
| C12 | 7.03 pF |
| L2 | 378 μm × 378 μm, 5.5 turns |
| L3 | 533 μm × 378 μm, 5.5 turns |
| T1 | TRANSFORMER 3 "N8L500" (498 μm × 498 μm), Primary 4.0 turns, Secondary 4.0 turns |

TABLE V

| Component Name | Component Value |
|---|---|
| Q1 | (6 × 100) × 1.0 μm |
| Q2 | (6 × 100) × 1.0 μm |
| R7 | 15 Ω (thin film) |
| R8 | 150 Ω (thin film) |
| R | RF port |
| I | IF port |
| L | LO port |
| 1 | Bias port 1 |
| C2 | 4.51 pF |
| C3 | 5.17 pF |
| C8 | 20.08 pF |
| C10 | 5.15 pF |
| C11 | 2.70 pF |
| C12 | 7.03 pF |
| C21 | 0.80 pF |
| L3 | 497 μm × 378 μm, 5.5 turns |
| T3 | TRANSFORMER 3 "N8L500" (498 μm × 498 μm), Primary 4.0 turns, Secondary 4.0 turns |

TABLE VI

| Component Name | Component Value |
|---|---|
| Q1 | (6 × 100) × 1.0 μm |
| Q2 | (6 × 100) × 1.0 μm |
| Q5 | (4 × 150) × 1.0 μm |
| Q6 | (2 × 120) × 1.0 μm |
| R1 | 200 Ω |
| R2 | 200 Ω |
| R5 | 400 Ω |
| R6 | 200 Ω |
| R | RF port |
| I | IF port |
| L | LO port |
| 1 | Bias port 1 |
| C2 | 2.58 pF |
| C3 | 6.69 pF |
| C5 | 16.13 pF |
| C6 | 2.20 pF |
| C7 | 5.03 pF |
| C8 | 20.08 pF |
| C21 | 0.99 pF |
| C11 | 41.63 pF |
| L1 | 338 μm × 338 μm, 4.75 turns |
| L2 | 378 μm × 378 μm, 5.5 turns |
| L3 | 533 μm × 378 μm, 5.5 turns |
| L4 | {278 μm × 10 μm} line |
| T1 | TRANSFORMER 1 'N6L450" (448 μm × 448 μm), Primary 3.0, Secondary 3.0 |

I claim:

1. A signal mixing device for generating a mixer output signal comprising:

a first and a second FET, each having a gate and a drain and a source, said first and second FETs having their gates tied to one another and their sources tied to one another such that said first and second FETs are connected source-to-source in series and have substantially equal magnitude gate-to-source voltages at all times and have substantially equal magnitude but opposite sign drain-to-source voltages at all times, said second FET drain connected to ground;

an RF/IF diplexer circuit connected to said first FET drain and having an RF signal coupling port and an IF signal coupling port for communicating RF and IF signals between said first FET drain and external sources and sinks of RF and IF signals;

a transformer having a primary and secondary portion, said primary portion having a first terminal connected to a LO input port for receiving an external LO input signal and a second terminal connected to ground, said secondary portion having a third terminal connected to said FET gates and a fourth terminal connected to said FET sources, said secondary winding and said FET gates and sources floating and not tied to ground;

said transformer receiving said local oscillator signal and generating a floating drive signal between said joined gate terminals and said joined source terminals to switch the conduction state of said serially connected FETs between a conducting state and a non-conducting state;

said diplexer receiving an input signal and coupling said input signal to said first FET drain, said input signal passing through the channel combination formed by said first and second FETs during the time said FETs are conducting and mixing said floating local oscillator signal with said input signal to generate said output signal;

said first FET introducing a first component of intermodulation distortion in said output signal related to the change in channel resistance of said first FET during channel conduction, and said second FET introducing a second component of intermodulation distortion in said output signal related to the change in channel resistance of said second FET during channel conduction, said second component being about equal in magnitude but opposite in sign to said first component; said back-to-back serial FET connection being operative to sum and cancel said first distortion component with said second distortion component so that the overall intermodulation distortion introduced in said mixer output signal is suppressed; and said diplexer having an output port for extracting said output signal.

2. The mixer in claim 1, wherein said input signal is an RF signal and said output signal is an IF signal.

3. The mixer in claim 1, wherein said input signal is an IF signal and said output signal is an RF signal.

4. The mixer in claim 1 wherein each of said diplexer, transformer, and first and second FET are formed on a single integrated monolithic substrate.

5. The mixer in claim 1 further comprising an isolation capacitor, wherein said isolation capacitor is interposed between a terminal of said transformer secondary portion and said FET gate terminals.

6. The mixer in claim 1, wherein said diplexer further comprises:

a first capacitor (C2) having first and second terminals serially connected to a first inductor (L2) having first and second terminals, said second terminal of inductor L2 being grounded and the second terminal of capacitor C2 being connected directly to the Q1 drain;

a second capacitor (C3) having first and second terminals serially connected to a second inductor (L3) having first and second terminals, said second terminal of capacitor C3 being connected to ground and said second terminal of inductor L3 being connected to the drain of Q1 and also to said second terminal of capacitor C2;

said diplexer operating to separate RF and IF frequency signals at an RF port and an IF port.

7. The mixer in claim 6, wherein each of said diplexer, transformer, and first and second FETs are formed on a single integrated monolithic substrate.

8. A mixer circuit comprising:

a first switching device having a first terminal and a second terminal;

a second switching device substantially matched to said first switching device and having a third terminal and a fourth terminal, said first terminal corresponding with said fourth terminal and said second terminal corresponding with said third terminal;

said first and second switching devices being back-to-back serially connected with said second terminal being connected to said third terminal to form a common circuit node and said four terminal being connected directly to ground; and an isolation circuit adapted to receive an external local oscillator signal at a two-terminal input port and to generate a floating switching signal at a two-terminal output port, said output port coupled to said common circuit node of said first and second switching devices.

9. The mixer circuit in claim 8, wherein said first and second switching devices comprise transistors, said first terminal being a drain and said second terminal being a source of said first transistor, said third terminal being a source and said fourth terminal being a drain of said second transistor, each said transistor further comprising a gate control terminal, said floating switching signal being coupled across said gate control terminal and said common circuit node formed by the connection of said first transistor source and said second transistor source.

10. The mixer circuit in claim 8, wherein said first and second switching devices comprise FETs, each said FET further comprising a common gate terminal wherein said gate terminals are connected together, said first terminal comprising a drain, said second terminal comprising a source, said third terminal comprising a source, and said fourth terminal comprising a drain connected to ground; said source of said first FET being connected to said source of said second FET, wherein said floating switching signal is coupled across said common gate terminals and said common source terminals.

11. The mixer circuit in claim 8, wherein said isolation circuit comprises a transformer.

12. The mixer circuit in claim 11, wherein said isolation circuit further comprises an isolation capacitor.

13. The mixer in claim 9, further comprising a first impedance element coupled across said first FET drain and source terminals, and a second impedance element coupled across said second FET drain and source terminals.

14. A mixer circuit comprising:

first and second matched FET transistors each having an input terminal, an output terminal, and a control terminal, one of said output terminals being connected directly to ground and the other of said output terminals being connected to the input terminal of said switching device having a grounded output terminal to form a common circuit node;

an isolation circuit adapted to receive an external local oscillator signal at a two-terminal input port and to generate a floating switching signal and couple said floating switching signal across said control terminal and said common circuit node;

a first impedance element coupled across said first FET drain and source terminals comprising a first resistor; and a second impedance element coupled across said second FET drain and source terminals comprising a second resistor having substantially the same resistance value as said first resistor;

said first and second resistors enforcing voltage synchronization across said first and second FETs and improving third order intercept point of said mixer circuit.

15. A mixer circuit comprising:

first and second matched FET transistors each having an out terminal, an output terminal, and a control terminal, one of said output terminals being connected directly to ground and the other of said output terminals being connected to the input terminal of said switching device having a grounded output terminal to form a common circuit node;

an isolation circuit adapted to receive an external local oscillator signal at a two-terminal input port and to generate a floating switching signal and couple said floating switching signal across said control terminal and said common circuit node;

a first impedance element coupled across said first FET drain and source terminals comprising a first capacitor; and a second impedance element coupled across said second FET drain and source terminals comprising a second capacitor having substantially the same capacitance value as said first capacitor.

16. A mixer circuit comprising:

first and second matched FET switching elements each having an input terminal and an output terminal, one of said output terminals being connected directly to ground and the other of said output terminals being connected to the input terminal of said switching device having a grounded output terminal to form a common circuit node; and an isolation circuit having a transformer and an isolation capacitor adapted to receive an external local oscillator signal at a two-terminal input port and to generate a floating switching signal at a two-terminal output port, said output port coupled to said first and second switching devices; and a compensating switching element including matched third and fourth FETs connected in back-to-back manner at a common source terminal and separately at a common gate terminal, said third and fourth FETs having floating drain terminals; said first, second, third, and fourth FETs having substantially matched electrical characteristics; a common gate of said first and second FETs coupled to said common source terminal of said third and fourth FETs, and a common source terminal of said first and second FETs being coupled to said common gate of said third and fourth FETs; said compensating switching element acting to symmetrize nonlinear capacitance exhibited by said first and second FETs and making them easier to drive by a resonant tuned amplifier and improving the symmetry of the resulting gate drive waveform.

17. A signal mixing device for generating a mixer output signal comprising:

a first FET and a second FET, each said FET having a gate and a drain and a source, said first and second FETs having their gates tied to one another and their sources tied to one another such that said first and second FETs are serially connected source-to-source and have substantially equal magnitude gate-to-source voltages at all times and have substantially equal magnitude but opposite sign drain-to-source voltages at all times, said FET gates and FET sources floating and not tied to ground and said second FET drain connected to ground; and a drive signal generating circuit generating a floating drive signal between said joined FET gates and said joined FET sources to switch the conduction state of said serially connected FETs between a conducting state and a non-conducting state, said first FET drain receiving an external input signal and said input signal passing through a channel combination formed by said first and second FETs during the time said FETs are conducting and mixing said floating drive signal with said input signal to generate said output signal;

said first FET introducing a first component of intermodulation distortion in said output signal related to the change in channel resistance of said first FET during channel conduction, and said second FET introducing a second component of intermodulation distortion in said output signal related to the change in channel resistance of said second FET during channel conduction, said second component being substantially equal in magnitude but opposite in sign to said first component; said source-to-source serial FET connection being operative to sum and cancel said first distortion component with said second distortion component so that the overall intermodulation distortion introduced in said mixer output signal is suppressed.

18. The mixer in claim 17, wherein said input signal is an RF signal and said output signal is an IF signal.

19. The mixer in claim 17, wherein said input signal is an IF signal and said output signal is an RF signal.

20. The mixer in claim 17, wherein said drive signal comprises a local oscillator signal.

* * * * *